(12) United States Patent
Shin et al.

(10) Patent No.: US 8,362,935 B2
(45) Date of Patent: Jan. 29, 2013

(54) DEVICE AND METHOD FOR CONTROLLING REFERENCE VOLTAGE OF DIGITAL-TO-ANALOG CONVERTER

(75) Inventors: Sun-Kyung Shin, Goyang-si (KR); Chul-Sang Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 46 days.

(21) Appl. No.: 13/188,321

(22) Filed: Jul. 21, 2011

(65) Prior Publication Data
US 2012/0146826 A1   Jun. 14, 2012

(30) Foreign Application Priority Data
Dec. 13, 2010   (KR) ................. 10-2010-0126914

(51) Int. Cl.
*H03M 1/10*   (2006.01)
(52) U.S. Cl. ........................... 341/120; 341/118

(58) Field of Classification Search .................. 341/120, 341/121, 116, 119, 139, 156, 159, 155, 118, 341/172, 154; 345/690, 87, 98, 204
See application file for complete search history.

(56) References Cited

U.S. PATENT DOCUMENTS
5,218,362 A * 6/1993 Mayes et al. ................. 341/121
* cited by examiner

*Primary Examiner* — Joseph Lauture
(74) *Attorney, Agent, or Firm* — Birch, Stewart, Kolasch & Birch, LLP (57) ABSTRACT

The present invention relates to device and method for controlling a reference voltage of a digital-to-analog converter for minimizing variation of output voltages among LED driving chips which drive an LED (Light Emitting Diode) backlight.

4 Claims, 7 Drawing Sheets

DEVICE AND METHOD FOR CONTROLLING REFERENCE VOLTAGE OF DIGITAL-TO-ANALOG CONVERTER

CROSS REFERENCE TO RELATED APPLICATION

This application claims the priority benefit of the Korean Patent Application No. 10-2010-0126914, filed on Dec. 13, 2010, which is hereby incorporated by reference as if fully set forth herein.

BACKGROUND OF THE DISCLOSURE

1. Field of the Disclosure

The present invention relates to liquid crystal display devices, and more particularly to device and method for controlling a reference voltage of a digital-to-analog converter for minimizing variation of output voltages among LED driving chips which drive an LED (Light Emitting Diode) backlight.

2. Discussion of the Related Art

As information oriented society is developed, demands on image display devices increase in a variety of modes, and recently, many kinds of flat display devices, such as liquid crystal display devices, field emission display devices, plasma display panels, and light emitting display devices, are utilized.

Among the flat display devices, the liquid crystal display device displays a desired image as a liquid crystal panel having a matrix of pixel cells controls transmissivity of a light from the backlight unit.

Though fluorescent lamps are mostly used as a light source of the backlight unit in a related art, currently, an LED (Light Emitting Diode) is used as the light source of the backlight unit, which is favorable in view of power consumption, weight, brightness, and so on, instead of the fluorescent lamps according to a current trend of making the backlight unit smaller, thinner, and lighter than before.

The LED backlight unit has a combination of red, green, and blue or white LEDs, to emit the light by supplying a driving current to the LEDs. Accordingly, the backlight unit controls brightness of the backlight by controlling intensity of the driving current to the LEDs of the backlight.

However, since the LED backlight unit also becomes larger keeping pace with a trend in which the liquid crystal display device becomes larger, it is the present situation that reliability of the backlight unit enlarged thus becomes poor. In detail, the LED backlight unit controls the driving current to the LEDs with a plurality of LED driving ICs (Integrated Circuits). However, as the LED backlight unit becomes larger, a number of the LED driving ICs and a number of the LEDs matched to the LED driving ICs increase to cause variation of driving voltages (Currents) supplied to the LEDs greater.

Consequently, in the related art, each of the LED driving ICs is designed to have an internal storage device (EEPROM), a DAC Trimming circuit, and a plurality of fuses, for compensating an offset value (or a variation value) stored in advance according to an experimental value. However, since this design makes a driving method and an internal structure of each of the LED driving ICs complicate and a process for manufacturing the LED drive ICs complicate, this design has various problems such as increased cost and time for production of the LED drive ICs.

Moreover, mismatch in fabrication processes causes an offset between a receiver circuit and a comparator circuit which fall under chip interfaces of a semiconductor memory device. Consequently, a general semiconductor memory circuit has an offset adjusting circuit for adjustment of the offset.

A related art offset adjusting circuit will be described.

Figure 1:
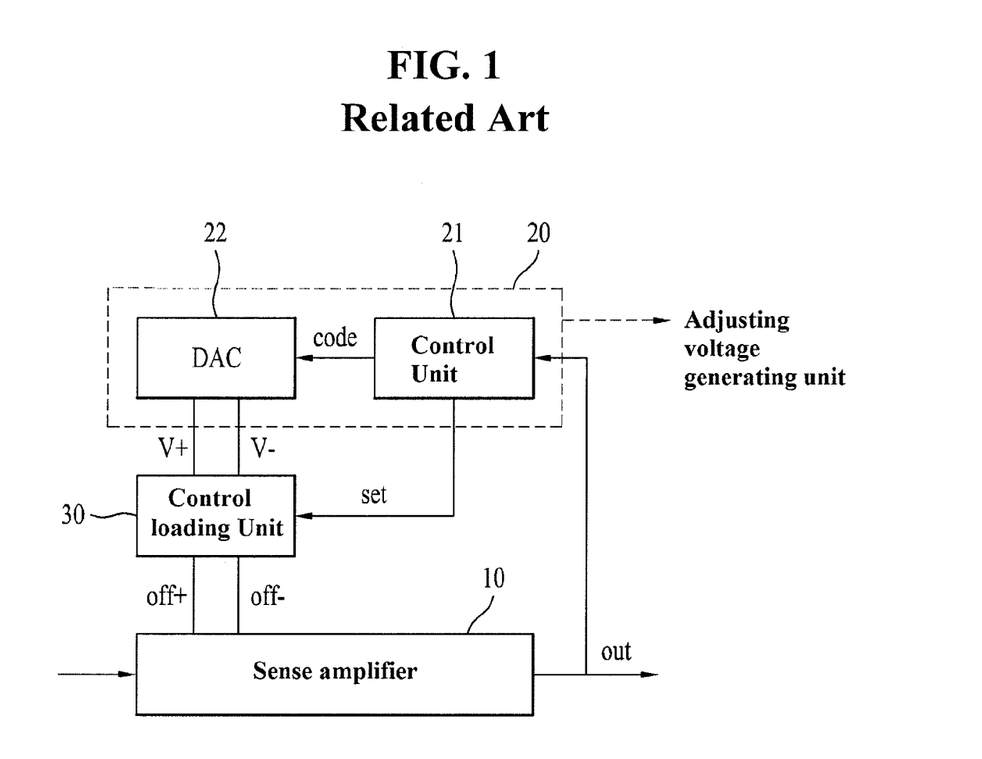
FIG. 1 illustrates a block diagram of a related art offset adjusting circuit.

FIG. 1 illustrates a block diagram of a related art offset adjusting circuit.

Referring to FIG. 1, the related art offset adjusting circuit is provided with a sense amplifier 10, a correction voltage generating unit 20, and a control loading unit 30.

The sense amplifier 10 receives an input signal in and an offset voltage (off+, off−) for generating an output signal (out).

The correction voltage generating unit 20 receives the output signal (out) for generating a correction voltage (v+, v−) and a control signal (set). That is, the correction voltage (v+, v−) is varied until a voltage of the output signal (out) reaches to a target voltage level, and when the voltage of the output signal (out) reaches to the target voltage level, the correction voltage (v+, V−) being generated thus is maintained, and the control signal (set) is enabled.

The correction voltage generating unit 20 has a control unit 21 and a digital-to-analog converter (DAC) 22.

The control unit 21 receives the output signal (out) for generating a code signal and the control signal (set). That is, the control unit 21 makes up or down counting of the code signal until transition of a level of the output signal (out) occurs, and if the level of the output signal (out) transits, the control unit 21 makes up or down counting of the code signal no more, but makes the control signal (set) to enable.

The digital-to-analog converter 22 receives the code signal for generating the correction voltage (v+, v−). For an example, if the control unit 21 generates first to sixth code signals (code0~code5), the digital-to-analog converter 22 generates six stages of positive correction voltages (v+) and negative correction voltages (v−) each having a fixed width of variation corresponding to the first to sixth codes (code0~code5).

The control loading unit 30 receives the correction voltage (v+, v−) and the control signal (set) for generating the offset voltage (off+, off−). That is, if the control signal (set) is disabled, the control loading unit 30 provides the correction voltage (v+, v−) as the offset voltage (off+, off−), and, if the control signal (set) is enabled, the control loading unit 30 maintains the offset voltage (off+, off−) (See Korean Laid Open patent No. 10-2010-0041391).

However, the related art offset adjusting circuit has the following problems.

That is, since the related art offset adjusting circuit has a structure in which the offset of the reference voltage on one digital-to-analog converter is corrected, in order to apply the related art offset adjusting circuit to a system having a plurality of the digital-to-analog converters, it is required to add the related art offset adjusting circuits as many as a number of the digital-to-analog converters, causing a problem in that a plurality of the reference voltages corresponding to the number of digital-to-analog converters must be controlled.

SUMMARY OF THE DISCLOSURE

Accordingly, the present invention is directed to device and method for controlling a reference voltage of a digital-to-analog converter.

An object of the present invention is to provide device and method for controlling a reference voltage of a digital-to-analog converter, in which a channel voltage of each of LED backlight driving ICs is measured with an external test instrument, and a generated code value is stored in an internal memory for minimizing a variation of a voltage of a chip to a reference voltage.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a device for controlling a reference voltage of a digital-to-analog converter includes an internal chip having an internal memory and a digital-to-analog converter for forwarding an analog voltage to each of the channels by a reference voltage, a reference voltage adjusting value estimating unit for measuring the voltage from the internal chip to each of the channels, estimating a maximum value and a minimum value thereof primarily, and estimating a reference voltage adjusting value which can minimize a variation between the channels with reference to the reference voltage based on the estimated maximum value and minimum value, and a code generating unit for generating two kinds of code values of a coarse TRIM value which corrects the reference voltage in a great scale and a fine TRIM value which corrects the reference voltage in a fine scale based on the reference voltage adjusting value from the reference voltage adjusting value estimating unit, and storing the two kinds of code values at a designated address of the internal memory for controlling the reference voltage.

In another aspect of the present invention, a method for controlling a reference voltage of a digital-to-analog converter having an internal memory and a digital-to-analog converter for forwarding a received digital voltage as an analog voltage to each of the channels by a reference voltage, includes the steps of measuring a voltage forwarded from the digital-to-analog converter to each of the channels to estimate a maximum value Vmax and a minimum value Vmin thereof, calculating a reference voltage adjusting value which can minimize a variation between the channels with reference to the reference voltage based on the estimated maximum value and minimum value, generating two kinds of code values of a coarse TRIM value which corrects the reference voltage in a great scale and a fine TRIM value which corrects the reference voltage in a fine scale based on the reference voltage adjusting value calculated thus, and storing the two kinds of code values at a designated address of the internal memory, and controlling the reference voltage according to the code value stored in the internal memory.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 2:
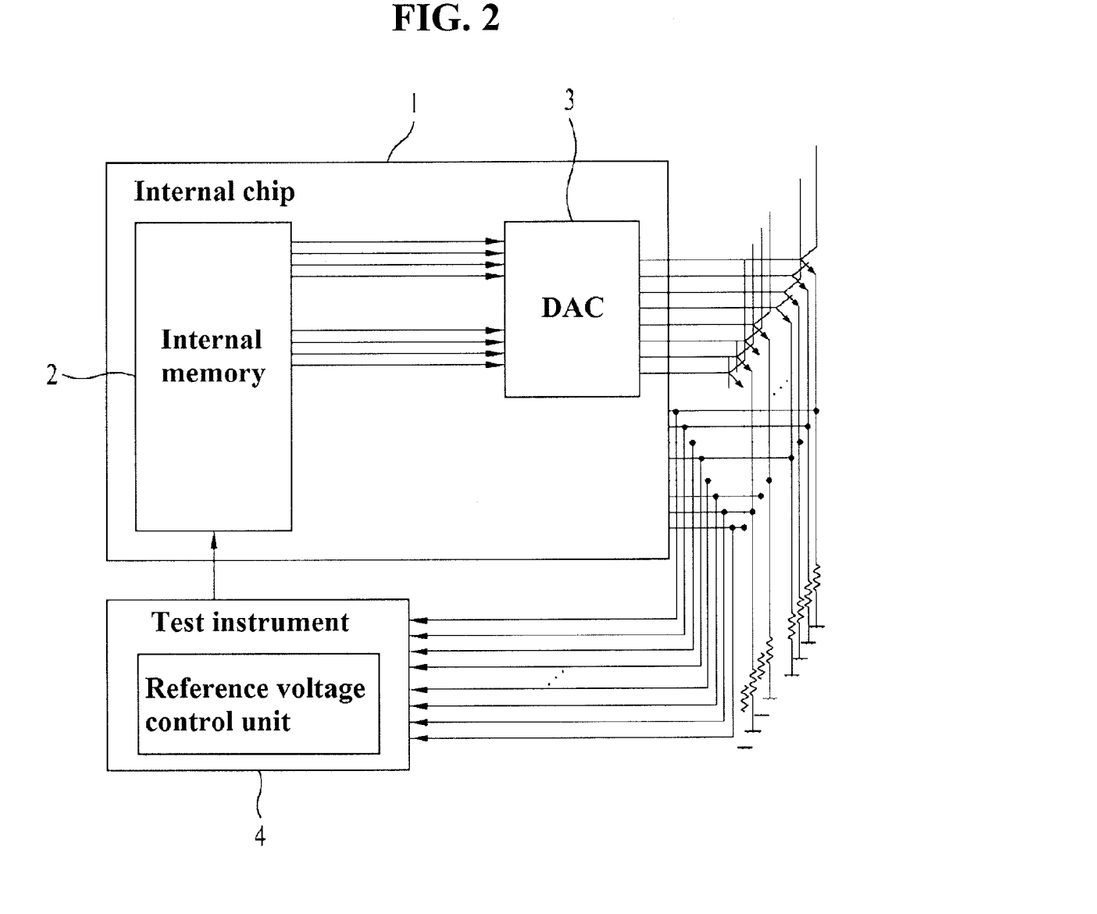
FIG. 2 illustrates a block diagram of a device for controlling a reference voltage of a digital-to-analog converter in accordance with a preferred embodiment of the present invention.
Figure 3:
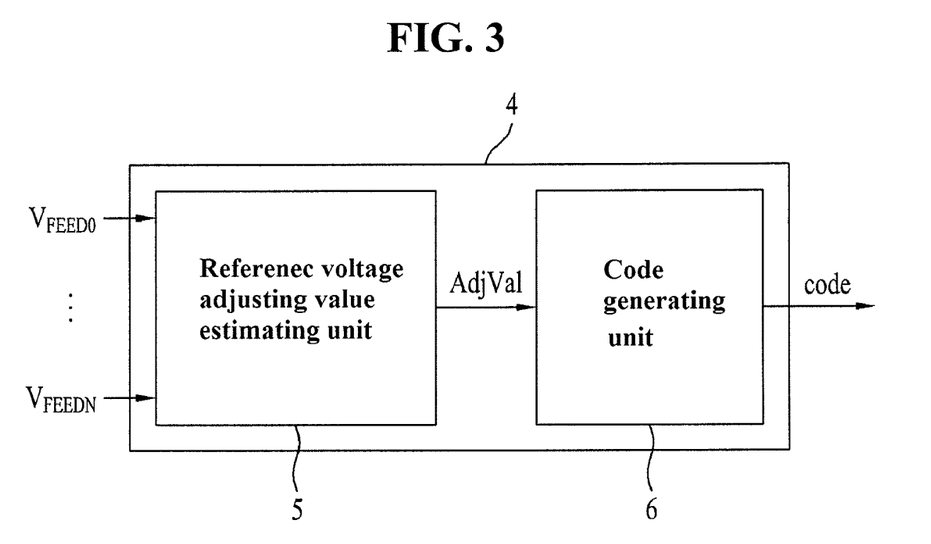
FIG. 3 illustrates a block diagram of a test instrument in accordance with a preferred embodiment of the present invention.

FIG. 2 illustrates a block diagram of a device for controlling a reference voltage of a digital-to-analog converter in accordance with a preferred embodiment of the present invention, and FIG. 3 illustrates a block diagram of a test instrument in accordance with a preferred embodiment of the present invention.

Referring to FIG. 2, the device for controlling a reference voltage of a digital-to-analog converter includes an internal chip 1 having an internal memory 2 and a DAC 3 for forwarding an analog voltage to each channel according to a preset reference voltage, and a test instrument 4 for measuring the voltage forwarded to each of the channels from the internal chip 1 to generate a code value which falls under a correction value and store the same at a designated address of the internal memory 2.

Referring to FIG. 3, the test instrument 4 includes a reference voltage adjusting value estimating unit 5 for measuring the voltage from the internal chip 1 to each of the channels, estimating a maximum value and a minimum value thereof primarily, and estimating a reference voltage adjusting value which can minimize a variation between the channels with reference to the reference voltage based on the estimated maximum value and minimum value, and a code generating unit 6 for generating two kinds of code values of a coarse TRIM value which corrects the reference voltage in a great scale and a fine TRIM value which corrects the reference voltage in a fine scale based on the reference voltage adjusting value from the reference voltage adjusting value estimating unit 5.

A method for controlling a reference voltage of a digital-to-analog converter will be described.

Figure 4:
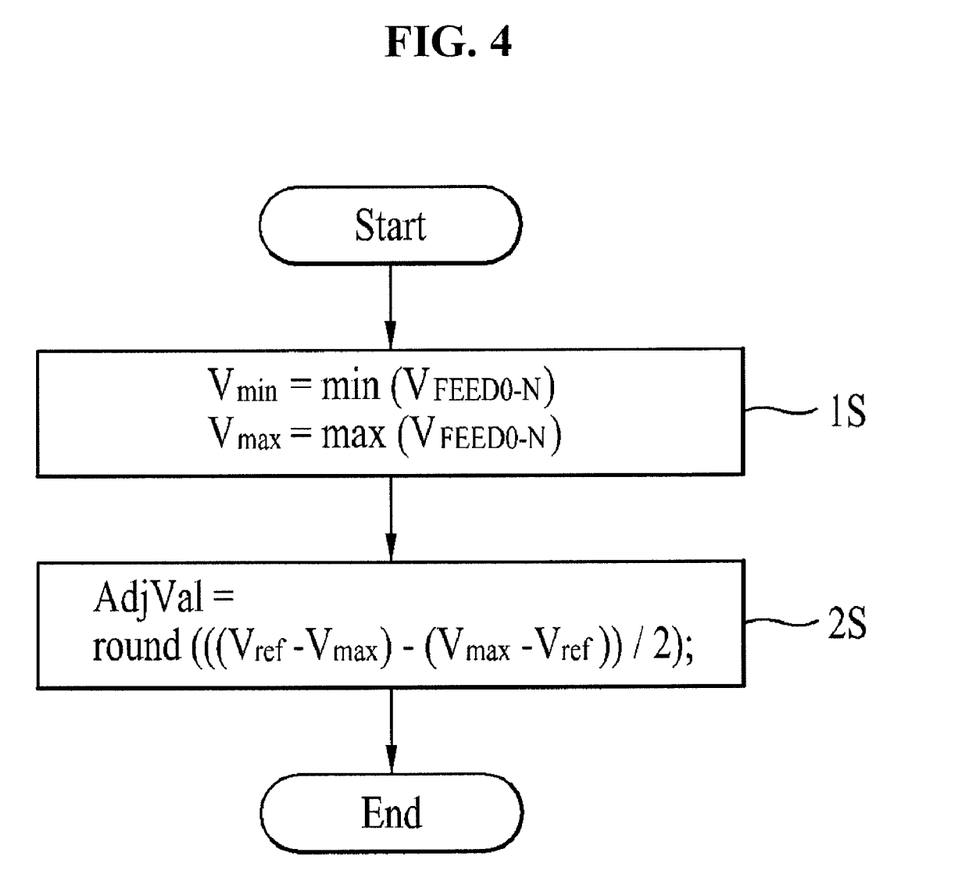
FIG. 4 illustrates a flow chart showing an operation flow of a reference voltage adjusting value estimating unit in accordance with a preferred embodiment of the present invention.
Figure 5:
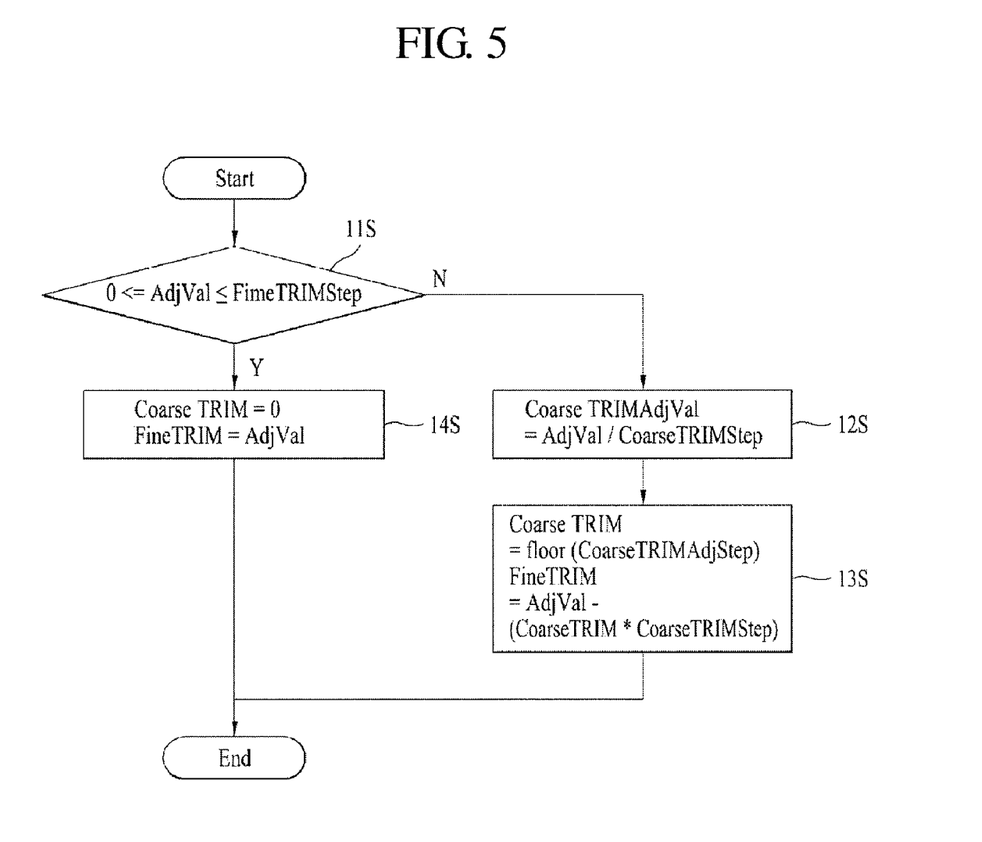
FIG. 5 illustrates a flow chart showing an operation flow of a code generating unit in accordance with a preferred embodiment of the present invention.

FIG. 4 illustrates a flow chart showing an operation flow of the reference voltage adjusting value estimating unit 5 which measures the voltages from the digital-to-analog converter to each of the channels to estimate the reference voltage adjusting value which minimizes a variation between the channels with reference to the reference voltage, and FIG. 5 illustrates a flow chart showing an operation flow of a code generating unit 6 which generates the code value which corrects the reference voltage based on the reference voltage adjusting value at the digital-to-analog converter of the present invention.

Referring to FIG. 4, the reference voltage adjusting value estimating unit 5 measures the voltage from the internal chip 1 to each of the channels and estimates a maximum value Vmax and a minimum value Vmin primarily (1S).

Then, the reference voltage adjusting value estimating unit 5 calculates a reference voltage adjusting value AdjVal which can minimize the variation between the channels with reference to the reference voltage (2S). The reference voltage adjusting value AdjVal is calculated by obtaining a difference of a value Vref–Vmin obtained by subtracting the minimum value estimated thus from the preset reference value and a value Vmax-Vref obtained by subtracting the reference value from the maximum value estimated thus, dividing the difference of the values with 2, and taking an absolute value of the divided value. That is, the reference voltage adjusting value AdjVal is an absolute value of {(the reference voltage–the minimum value)–(the maximum value–the reference value)/2}.

For an example, if it is assumed that the reference voltage is set to be 500 mV, and the voltage from the internal chip 1 to the channels measured thus has the maximum value Vmax of 600 mV and a minimum value Vmin of 420 mV, the reference voltage adjusting value of 10 mV is calculated by taking the absolute value of {(500–420)-(600–500)}/2.

And, referring to FIG. 5, the code generating unit 6 generates two kinds of code values of a coarse TRIM value which corrects the reference voltage in a great scale and a fine TRIM value which corrects the reference voltage in a fine scale based on the reference voltage adjusting value AdjVal from the reference voltage adjusting value estimating unit 5.

First, the coarse TRIM value and the fine TRIM value are preset (CoarseTRIMStep, FineTRIMStep).

Then, it is determined whether the reference voltage adjusting value AdjVal is greater than the fine TRIM value FineTRIMStep or not (11S).

If the reference voltage adjusting value AdjVal is smaller than, or the same with, the fine TRIM value FineTRIMStep preset thus, the coarse TRIM value is adjusted to be "0", an the reference voltage adjusting value AdjVal is set to be the fine TRIM value (14S).

If the reference voltage adjusting value AdjVal is greater than the fine TRIM value FineTRIMStep preset thus, the reference voltage adjusting value AdjVal is divided by the coarse TRIM value CoarseTRIMStep preset thus to calculate a primary coarse TRIM adjusting value CoarseTRIMAdjStep (S12). Then, the primary coarse TRIM adjusting value CoarseTRIMAdjStep is rounded off to trim a value below a decimal point to produce a coarse TRIM value CoarseTRIM, and a value CoarseTRIM*CoarseTRIMStep obtained by multiplying the coarse TRIM value CoarseTRIM to the coarse TRIM value CoarseTRIMStep is subtracted from the reference voltage adjusting value AdjVal to produce a fine TRIM value FineTRIM.

For an example, if it is assumed that the coarse TRIM value CoarseTRIMStep is preset to be "5" and the fine TRIM value FineTRIMStep is preset to be "1", the following will be obtained.

In the description with reference to FIG. 4, since the reference voltage adjusting value AdjVal is "10 mV", the reference voltage adjusting value AdjVal is greater than the "1" of the fine TRIM value FineTRIMStep preset thus (11S). Therefore, if the reference voltage adjusting value AdjVal is divided by the coarse TRIM value CoarseTRIMStep preset thus, the primary coarse TRIM adjusting value CoarseTRIMAdjStep will be 10/5=2 (12S).

Then, the primary coarse TRIM adjusting value CoarseTRIMAdjStep is rounded off to trim a value below a decimal point to produce the coarse TRIM value CoarseTRIMStep of "2". Then, by subtracting the value CoarseTRIM*CoarseTRIMStep 5*2 obtained by multiplying the coarse TRIM value CoarseTRIM produced thus to the coarse TRIM value CoarseTRIMStep from the reference voltage adjusting value AdjVal "10 mV", the fine TRIM value FineTRIMStep of "0" is produced (13S).

The code value which is the coarse TRIM value and the fine TRIM value produced by above method is stored at a designated address of the internal memory 2 of the internal chip 1.

And, since the DAC 3 forwards a voltage to each of the channels by using the reference voltage corresponding to the code value stored at that internal memory 2 thus, the variation of outputs from the chip is adjusted.

Figure 6:
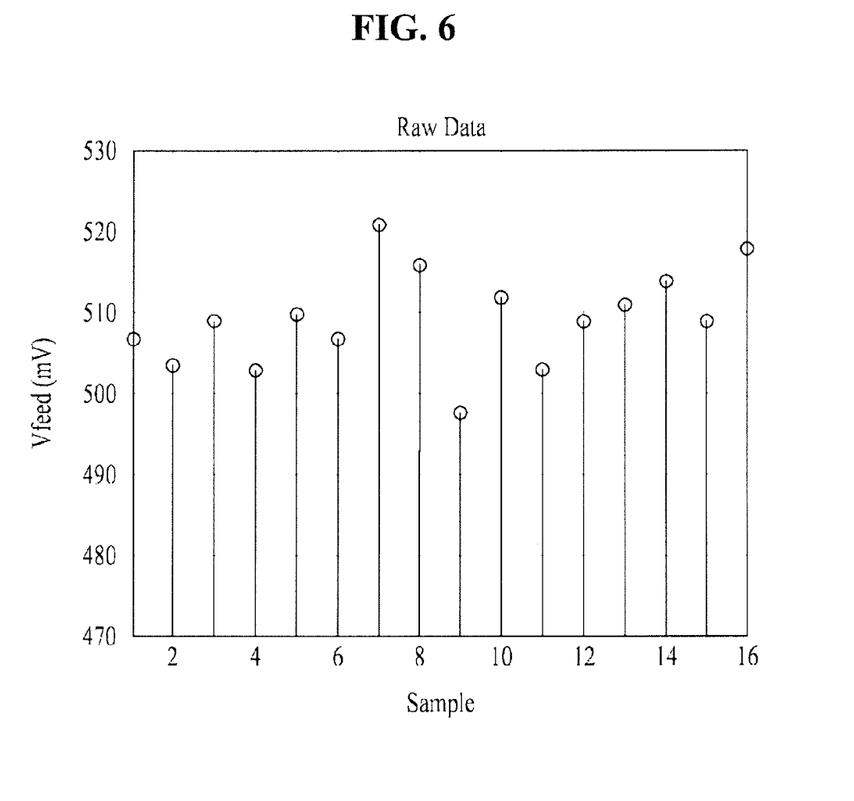
FIG. 6 illustrates a graph showing a distribution of reference voltages of a related art digital-to-analog converter.
Figure 7:
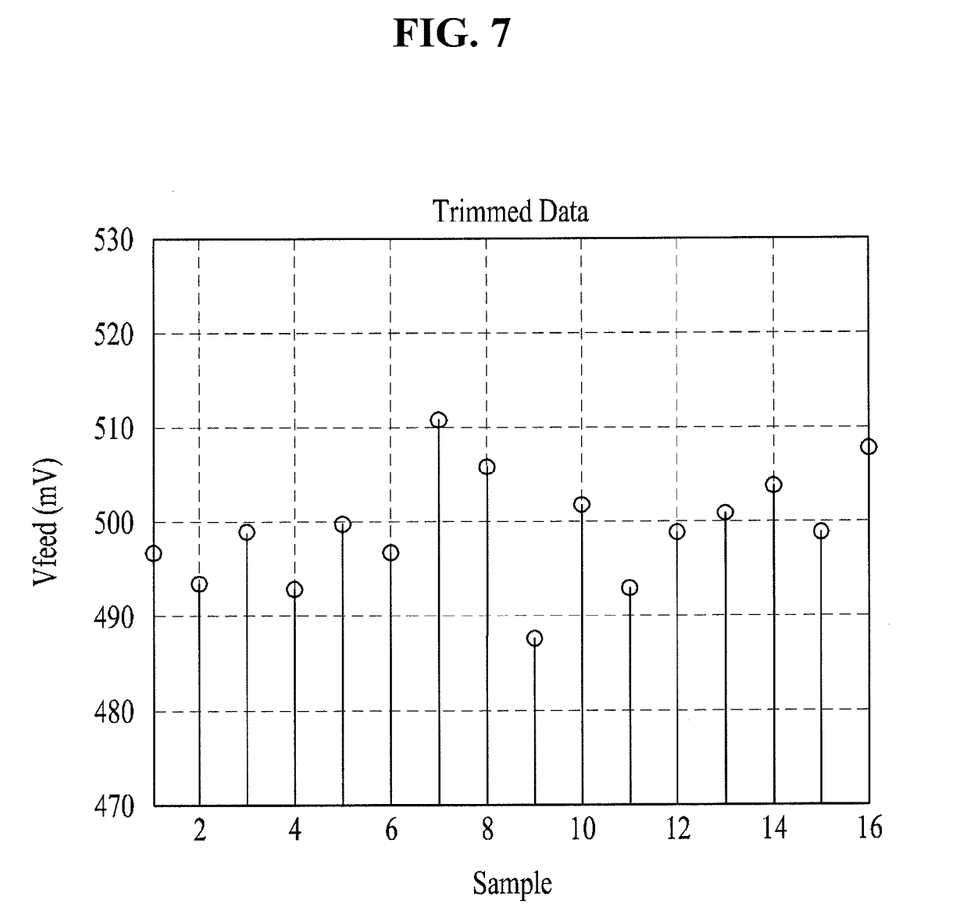
FIG. 7 illustrates a graph showing a distribution of reference voltages done by a reference voltage control method of a digital-to-analog converter in accordance with a preferred embodiment of the present invention.

FIG. 6 illustrates a graph showing a distribution of reference voltages of a related art digital-to-analog converter, and FIG. 7 illustrates a graph showing a distribution of reference voltages done by a reference voltage control method of a digital-to-analog converter in accordance with a preferred embodiment of the present invention.

FIG. 6 illustrates a graph of voltages at respective channels when the reference voltage is 500 mV, showing a normal distribution with an average output voltage of 510 mV and a standard deviation of 5. In FIG. 6, it can be known that the deviation on the maximum value and the minimum value is 4.2%.

However, if the method for controlling a reference voltage of a digital-to-analog converter of the present invention is applied to above data structure, the deviation on the maximum value and the minimum value is reduced to 2.4%. As a result of 1000 times of repetitive simulation of the method for controlling a reference voltage of a digital-to-analog converter of the present invention, it is found out that a 3.7354% deviation of original output voltages is reduced down to a 1.7826%.

As has been described, the device and method for controlling a reference voltage of a digital-to-analog converter have the following advantages.

Since the device and method for controlling a reference voltage of a digital-to-analog converter of the present invention measures the voltage from the digital-to-analog converter to each of channels to provide the minimum value and the maximum value, estimates the reference voltage adjusting value which can minimize variation among the channels with reference to the reference voltage based on the minimum value and the maximum value, generating two code values of the coarse TRIM value which corrects the reference voltage in a great scale and the fine TRIM value which corrects the reference voltage in a small scale based on the reference voltage adjusting value estimated thus, and controls the reference voltage, the variation of the output voltage can be minimized.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A device for controlling a reference voltage of a digital-to-analog converter, comprising:

an internal chip having an internal memory and a digital-to-analog converter for forwarding an analog voltage to each of a plurality of channels by a reference voltage;

a reference voltage adjusting value estimating unit for measuring the voltage from the internal chip to each of the channels, estimating a maximum value and a minimum value thereof primarily, and estimating a reference voltage adjusting value which can minimize a variation between the channels with reference to the reference voltage based on the estimated maximum value and minimum value; and a code generating unit for generating two kinds of code values of a coarse TRIM value which corrects the reference voltage in a great scale and a fine TRIM value which corrects the reference voltage in a fine scale based on the reference voltage adjusting value from the reference voltage adjusting value estimating unit, and storing the two kinds of code values at a designated address of the internal memory for controlling the reference voltage.

2. A method for controlling a reference voltage of a digital-to-analog converter having an internal memory and a digital-to-analog converter for forwarding a received digital voltage as an analog voltage to each of a plurality of channels by a reference voltage, comprising the steps of:

measuring a voltage forwarded from the digital-to-analog converter to each of the channels to estimate a maximum value Vmax and a minimum value Vmin thereof;

calculating a reference voltage adjusting value which can minimize a variation between the channels with reference to the reference voltage based on the estimated maximum value and minimum value;

generating two kinds of code values of a coarse TRIM value which corrects the reference voltage in a great scale and a fine TRIM value which corrects the reference voltage in a fine scale based on the reference voltage adjusting value calculated thus, and storing the two kinds of code values at a designated address of the internal memory; and controlling the reference voltage according to the code value stored in the internal memory.

3. The method as claimed in claim 2, wherein the step of calculating a reference voltage adjusting value includes:

a first step of subtracting the minimum value estimated thus from the reference value set thus, a second step of subtracting the reference value set thus from the maximum value estimated thus, and a third step of calculating an average of a difference of values calculated in the first step and the second step, and forwarding an absolute value of the average as a reference voltage adjusting value.

4. The method as claimed in claim 2, wherein the step of generating two kinds of code values of a coarse TRIM value and a fine TRIM value includes the steps of:

random presetting of a coarse TRIM value and a fine TRIM value, determining whether the reference voltage adjusting value AdjVal is greater than the fine TRIM value FineTRIM-Step or not, if the reference voltage adjusting value AdjVal is smaller than, or the same with, the fine TRIM value FineTRIM-Step preset thus, adjusting the coarse TRIM value to be "0", and setting the reference voltage adjusting value AdjVal to be the fine TRIM value, if the reference voltage adjusting value AdjVal is greater than the fine TRIM value FineTRIMStep preset thus, dividing the reference voltage adjusting value AdjVal by the coarse TRIM value CoarseTRIMStep preset thus to calculate a primary coarse TRIM adjusting value CoarseTRIMAdjStep, rounding off the primary coarse TRIM adjusting value CoarseTRIMAdjStep to trim a value below a decimal point to generate a coarse TRIM value CoarseTRIM, and subtracting a value CoarseTRIM*CoarseTRIMStep obtained by multiplying the coarse TRIM value CoarseTRIM to the coarse TRIM value CoarseTRIM-Step from the reference voltage adjusting value AdjVal to generate a fine TRIM value FineTRIM.

* * * * *